(12) United States Patent
Chenakin

(10) Patent No.: US 9,793,904 B1
(45) Date of Patent: Oct. 17, 2017

(54) SYSTEM AND METHOD OF NOISE CORRECTING PLL FREQUENCY SYNTHESIZERS

(71) Applicant: MICRO LAMBDA WIRELESS, INC., Fremont, CA (US)

(72) Inventor: Oleksandr Chenakin, Morgan Hill, CA (US)

(73) Assignee: Micro Lambda Wireless, Inc., Fremont, CA (US)

( * ) Notice: Subject to any disclaimer, the term of this patent is extended or adjusted under 35 U.S.C. 154(b) by 0 days.

(21) Appl. No.: 15/469,434

(22) Filed: Mar. 24, 2017

(51) Int. Cl.
*H03L 7/06* (2006.01)
*H03L 7/087* (2006.01)
*H03L 7/099* (2006.01)
*H03K 5/1252* (2006.01)

(52) U.S. Cl.
CPC ........... *H03L 7/087* (2013.01); *H03K 5/1252* (2013.01); *H03L 7/099* (2013.01)

(58) Field of Classification Search
CPC ....... H01L 2924/00; H01L 2924/00014; H01L 2224/48247; H01L 2224/73265; H01L 2224/32245
See application file for complete search history.

(56) References Cited

U.S. PATENT DOCUMENTS

| 7,701,299 | B2 | 4/2010 | Chenakin |
| 2010/0237958 | A1* | 9/2010 | Goel .................. H03F 3/45188 |
| | | | 331/135 |

OTHER PUBLICATIONS

Chenakin, A, "Frequency Synthesis: Current Solutions and New Trends", Microwave Journal, May 2007, pp. 256-266.
Chenakin, A, "Building a Microwave Frequency Synthesizer—Part 1: Getting Started", High Frequency Electronics, May 2008, pp. 58-67.

* cited by examiner

*Primary Examiner* — Sibin Chen
(74) *Attorney, Agent, or Firm* — Stephen E. Zweig

(57) ABSTRACT

An improved noise-corrected phase-locked loop frequency synthesizer configured to reduce noise, such as phase noise and spurious signals, without the use of switching circuits. The synthesizer uses a phase shifter device configured to accept a noise containing frequency signal from a voltage controlled oscillator (VCO) circuit, such as an integer-N single loop PLL synthesizer, as well as noise reducing control signals from a noise detecting sensor or circuit, and output a noise reduced VCO frequency signal. In some embodiments, the noise reducing sensor may be formed from a second, lower noise, phase locked loop circuit. The frequency synthesizer circuit, noise detecting sensor, and the phase shifter device are configured to all run continuously, with the noise reducing sensor and frequency shifter continually acting to reduce noise, produced by higher noise integer-N PLL frequency synthesizer.

15 Claims, 8 Drawing Sheets

SYSTEM AND METHOD OF NOISE CORRECTING PLL FREQUENCY SYNTHESIZERS

BACKGROUND OF THE INVENTION

Field of the Invention

This invention is in the field of phase-locked loop (PLL) frequency synthesizers.

Description of the Related Art

Frequency synthesizers are often used for microwave testing and measurement purposes. These are described by Chenakin, *"Frequency Synthesis: Current Solutions and New Trends"*, Microwave Journal, May 2007, pages 256-266; and Chenakin *"Building a Microwave Frequency Synthesizer—Part 1: Getting Started"* in High Frequency Electronics, May 2008, pages 58-67.

A frequency synthesizer is an electronic system that translates an input reference frequency signal to an output signal at a different frequency. Specifications such as output frequency range, step size, phase noise, spurious, and switching speed are important synthesizer characteristics. Trade-offs exist between many different design parameters. As just one example, switching speed, i.e. how fast the output frequency can be changed, may have to be sacrificed to reduce step size and/or phase noise.

FIG. 1 shows a simplified block diagram for a conventional or generic single phase lock loop (PLL) frequency synthesizer. This is also occasionally referred to as an "integer-N single-loop PLL synthesizer." The circuit is based on a voltage controlled oscillator (VCO) whose frequency output is locked in relation to a reference frequency by a feedback loop.

In simplified terms, in FIG. 1, the frequency signal output from the VCO goes to the power splitter (PS) which splits this VCO frequency signal into various portions. One portion is the output signal (f), and another portion of this VCO frequency signal is used to control the PLL synthesizer. This control portion of the VCO frequency signal is sent to a frequency divider, here designated (:N), which divides this portion of the VCO frequency signal by an integer N.

The resulting frequency divided signal then goes to a phase detector (PD). The phase detector compares this signal with a reference frequency ($F_{REF}$).

The reference frequency is typically chosen to be very stable low frequency signal, and can even be a crystal oscillator signal. The phase detector PD compares both the frequency of the frequency divided signal, and the frequency of the reference signal $F_{REF}$, and outputs a voltage proportional to the error (or difference) between these two frequencies. This voltage, after passing though the low pass filter LPF and the amplifier A, is used to drive the VCO up or down in frequency until eventually the phase detector (PD) detects that the frequency of the frequency divided signal and the $F_{REF}$ inputs are equal.

As a result, the frequency of the output signal f is essentially an N multiple of the reference frequency $F_{REF}$.

Describing FIG. 1 in somewhat more detail, the voltage controlled oscillator (VCO) generates an output signal at frequency f. A portion of this signal is fed back to the phase detector PD via power splitter PS and the frequency divider (:N). The frequency divider has a division ratio of N, meaning that its output frequency is N times less than its input frequency.

The other input to the phase detector is a reference frequency signal $F_{REF}$ which may be generated by a high-stability, fixed-frequency oscillator, such as the previously described crystal oscillator. The phase detector compares the two signals at its inputs and generates an error signal which is then fed through low pass loop filter LPF and amplifier A before reaching the voltage controlled oscillator. Therefore, phase detector, low pass filter, amplifier, VCO, power splitter and frequency divider form a loop circuit. The filtered and amplified error signal changes the frequency of the VCO until f is locked in relation to $F_{REF}$ given by: $f = F_{REF} \times N$.

If the frequency divider is programmable, as is often the case, the synthesizer can be programmed to generate any one of many frequencies within a range determined by the VCO.

Although ideally a frequency synthesizer would only output the desired frequency signal, such as a single pure frequency, in reality, frequency synthesizers are not ideal. In the real world, the output of a PLL frequency synthesizer is not a single pure frequency, but rather often a mixture of frequencies including both phase noise broadened pure frequencies, as well as certain spurious frequencies as well. Unfortunately each component in a PLL frequency synthesizer contributes some noise to the circuit, and in the frequency divider (:N) can often contribute a particularly large amount of phase noise to the circuit.

Phase noise is a manifestation of instability of the output frequency of a synthesizer and is observed as random frequency fluctuations around the desired output frequency. It is a limiting factor in the sensitivity of signal receivers. The level of phase noise near the desired carrier frequency depends on phase noise in the reference signal and on the synthesizer circuit design.

For a phase locked loop (PLL) circuit, the formula for synthesizer phase noise within the loop filter bandwidth is given by: $L = L_{PD} + 20 \log N$, where $L_{PD}$ is the cumulative phase noise of the reference signal, phase detector, feedback divider, loop filter and amplifier referred to the phase detector input, and N is the division ratio of the frequency divider.

In practice, the synthesizer phase noise performance is usually limited by the large division ratios required to provide high-frequency output with fine resolution. For example, to obtain 1 MHz frequency resolution at 10 GHz output, the feedback divider ratio is 10,000, corresponding to 80 dB phase noise degradation. This is a substantial amount of noise degradation, and as a result, various alternative methods to reduce this phase noise have been proposed.

One way to reduce the amount of phase noise is to minimize the division coefficient N, since higher values of N create more noise. One prior art way to do this is shown in FIG. 2.

FIG. 2 is a simplified block diagram for a conventional PLL frequency synthesizer with frequency conversion in the synthesizer feedback loop. In the figure, the voltage controlled oscillator (VCO) generates an output signal at frequency f. A portion of this signal is fed back to a phase detector PD via a power splitter PS, mixer M, and a frequency divider with a division ratio of N. The other input to the phase detector is a reference frequency signal $F_{REF}$. A digital-to-analog converter DAC is provided to translate digital tuning commands for coarse tuning.

In FIG. 2, however, the mixer reduces the maximum frequency division ratio by mixing the VCO output frequency with offset frequency $f_1$, which may be obtained from another phase-locked loop or frequency multiplier.

Put alternatively, the PLL synthesizer of FIG. 2 adds an extra mixer M within the phase lock loop. As a result, the portion of the VCO frequency signal f used for PLL control goes (via the power splitter) to the mixer. The mixer down converts this signal to a lower frequency that is divided by N', but otherwise contributes little or no phase noise to the circuit. Since the mixer M enables use of an alternate N' that is smaller than the original N, the frequency division not as great, and phase noise is not amplified nearly as much. Thus the phase noise signal degradation is substantially smaller.

Here $f_1$ is the mixer offset frequency, or mixer local oscillator (LO) frequency. In some embodiments, this is often a multiple of the reference frequency $F_{REF}$.

One issue with the mixer scheme of FIG. 2 is that the output of the mixer M, being a difference operation, is thus a difference frequency that can be either higher or lower than the reference frequency LO (f1). To minimize this uncertainty, the FIG. 2 circuit can be configured to initially bring the VCO frequency very close to the desired frequency f. In FIG. 2, this is done by using a digital-to-analog converter (DAC), which in response to a tuning command, can set the VCO driver voltage so that the VCO outputs a frequency very close to the desired frequency f. This setting can then be locked, in thus in effect pre-tuning the frequency synthesizer.

One drawback of FIG. 2 type circuits is that they sometimes suffer from false lock to spurious mixer products. Further, in the design of FIG. 2, mixer harmonic and intermodulation products can fall within the synthesizer loop bandwidth as shown in FIG. 3, creating still more undesired spurious signals.

FIG. 3 shows a spurious mixer product within the low pass filter response of the loop filter. So the mixers help reduce phase noise, but can then introduce some additional and unwanted spurious frequency products. The low pass filter frequency response (LPF response) is also shown.

Furthermore, the frequency divider (:N) is still present in the PLL loop, and this continues to degrade the phase noise characteristics of the synthesizer, although to a lesser extent than the circuit shown in FIG. 1. So the prior art FIG. 2 type circuits were not perfect either.

In an effort to reduce frequency synthesizer noise to an even greater extent, Chenakin, in U.S. Pat. No. 7,701,299, taught a switching based method, which essentially used the classic PLL techniques previously taught in FIG. 1 to "bootstrap" the frequency synthesizer. Once the first "classic" PLL circuit had set the operating frequency of the frequency synthesizer, a rapid switching circuit was then used to quickly switch the synthesizer away from the classic PLL loop, and into an alternate and lower noise second PLL loop. This switching based, dual PLL loop, frequency synthesizer device is shown in FIG. 4. The entire contents of U.S. Pat. No. 7,701,299 are incorporated herein by reference.

U.S. Pat. No. 7,701,299 thus used switching techniques to combine two different types of PLL synthesizers into one frequency synthesizer device, thus generating a high frequency signal with improved phase noise and lower spurious characteristics, relative to the devices previously taught in FIG. 1 and FIG. 2. These devices have since become relatively successful in the market.

FIG. 4 shows a simplified block diagram for the design taught by U.S. Pat. No. 7,701,299, which used a conventional but higher noise first PLL frequency synthesizer to initiate frequency synthesis. After the first PLL frequency synthesizer starts, this first PLL circuit is then switched out by switch SW. The switch instead selects a second and a lower noise frequency synthesizer, often driven by a second PLL that avoids use of the noisy frequency divider :N. This second and lower noise PLL circuit instead uses multiple frequency conversions in the second PLL synthesizer feedback loop to achieve frequency control.

In the circuit of FIG. 4, instead of using just one mixer M, the circuit uses a chain or series of mixers $M_1, M_2 \ldots M_{j-1}, M_j$. This series of mixers down converts the VCO output frequency signal to lower and lower frequencies at each mixer stage, until eventually the series of mixers down converts the VCO output frequency to a value $F_0'$ that is almost the same (ideally it will be the same) as the reference frequency, $F_0$.

In this particular scheme, the local oscillator (LO) signals corresponding or associated with each mixer stage M can be generated from the common reference frequency. In U.S. Pat. No. 7,701,299, these local oscillator signals were provided by using various frequency dividers: $D_1, D_2 \ldots D_{j-1}, D_j$ and various frequency multipliers $xC_1, xC_2 \ldots xC_{j-1}, xC_j$.

This chain of frequency mixers progressively down-converts a portion of the output frequency f to produce an output signal $F_0'$ that is almost the same as the reference frequency, $F_0$. This method minimizes phase noise degradation, and in particular the multiplicative effects on phase noise caused when high multiple :N frequency dividers are used.

However, for this scheme to work, the VCO must first be set at the correct frequency. If this is not done, then one or more of the mixer stages can fail, because the mixer output can then end up either on higher or lower in frequency than that mixer's particular LO signal, causing the synthesizer to accidentally lock onto a wrong (undesired) frequency.

Although DAC based VCO pre-tuning schemes, such as those described in FIG. 2 can be used, such pre-tuning schemes suffer from suboptimal accuracy. To resolve this problem, U.S. Pat. No. 7,701,299 used two phase locked loops, controlled by switch SW.

When switch 51 is placed in position 1, the mixers are disconnected, and the circuit eventually turns into a conventional single loop PLL frequency synthesizer, similar to that shown in FIG. 1. This is used to initially bring the VCO and frequency synthesizer to the desired output frequency f, but with more phase noise then desirable due to the use of the divider :N.

Then, after the synthesizer is initialized at the desired output frequency, the device is quickly switched to switch position 2. This engages the lower-phase noise mixer chain, and cuts out the noisy :N divider circuit. If the switching is done fast enough, the frequency relocks to the same output frequency, but now with significantly less phase noise.

Thus the FIG. 4 block diagram includes a tunable voltage controlled oscillator VCO connected to other components via a power splitter PS. The VCO output signal f is converted in mixers $M_1$-$M_i$ to the phase detector compassion frequency $F_0$ equal to the synthesizer step size (resolution). The comparison frequency as well as mixer LO signals $f_1 \ldots f_i$ are produced from a common high-stable, low phase noise reference signal $F_{REF}$ using frequency dividers with frequency division ratios $D_1$-$D_i$ and frequency multipliers with multiplication factors $C_1$-$C_i$ respectively. The multipliers can be comb generators, which output contains a large number of harmonics.

Mathematically, in FIG. 4, the phase detector PD can be considered to be comparing the signals at both inputs and producing a difference signal voltage which, following amplification and filtering in low-pass loop filter LPF and amplifier A respectively, slews the frequency of the VCO to a lock frequency given by $$f=f_i \pm f_{i-1} \pm \ldots \pm f_2 \pm f_1 \pm F_0,$$

in mathematical terms, this reduces to:

$$f=F_0(D_1D_2 \ldots D_{i-1}D_iC_i \pm D_1D_2 \ldots D_{i-1}C_{i-1} \pm \ldots \pm D_1D_2C_2 \pm D_1C_1 \pm 1).$$

Further, since all the division and multiplication coefficients are integer numbers, in the end, the circuit of FIG. 4 can be viewed as having a frequency output of:

$$f=F_0 \times N.$$

Thus the VCO of FIG. 4 can produce a large number of equally spaced output frequencies as shown in FIG. 5.

Thus the methods of U.S. Pat. No. 7,701,299 had several advantages. These included fewer spurious signals, due to the absence of undesired products within the loop bandwidth. Further, relative to the previous art shown in FIG. 1 and FIG. 2, the circuit of FIG. 4 has a better (lower amount of) phase noise, because the high multiple :N frequency divider can be quickly switched out of the synthesizer loop after frequency synthesizer initialization.

BRIEF SUMMARY OF THE INVENTION

The present invention is based, in part, on the insight that further improvements in the previous switching type designs of U.S. Pat. No. 7,701,299 would be desirable.

One drawback with the scheme of U.S. Pat. No. 7,701,299 is that its switch design requires two PLL filters with very different characteristics due to different loop gain for the divider-by-N and mixer paths. This makes difficult to optimize both these filters for phase noise and stability.

Another significant problem is caused by the U.S. Pat. No. 7,701,299's switching circuit. In order for the design of U.S. Pat. No. 7,701,299 to work optimally, switch SW must switch very rapidly between loop 1 and loop 2. No switch can operate instantaneously however, and in the transition time between position 1 and position 2, the circuit can experience some frequency jumps, and potential frequency lock failure.

In particular, during or after the switching time period, the circuit will experience a duration time of settling. During this switching and settling time, the VCO can start oscillating at a frequency that deviates from the desired frequency. Thus switching between two paths may result in abrupt phase shifts that may result in PLL instability or false lock.

The present invention is thus based, in part, on the insight that it would be useful to provide an improved frequency synthesizer that, while providing lower phase noise, avoids the problems of PLL instability or false locks that can occur when switching circuits are used.

The present invention is also based, in part, on the insight that it would be useful to provide an improved frequency synthesizer with a separate phase-lock mechanism (that is independent from the divider-by-N PLL path) to provide PLL stability and independent loop filter optimization.

To achieve these twin goals of avoiding use of switches, while still retaining some of the benefits of having improved noise over the prior art designs, the invention is also based, in part, on the insight of using an additional "noise reduction" mechanism that can act to reduce the noise in the VCO output frequency after the VCO output stage. Such noise reduction mechanisms can be achieved, for example, by using suitably driven phase shifter devices and noise detecting sensors or circuits.

Thus, as will be discussed, in some embodiments, the invention can comprise a noise-corrected phase-locked loop frequency synthesizer device or method. Expressing the concept in device terminology, this invention can comprise a phase shifter configured to simultaneously accept an uncorrected (e.g. noise containing) frequency from a VCO, as well as noise reducing control signals from a noise detecting sensor (alternatively termed a noise detecting circuit), and use these noise reducing control signal to output a noise-corrected (e.g. noise reduced) VCO frequency signal.

DETAILED DESCRIPTION OF THE INVENTION

Figure 1:
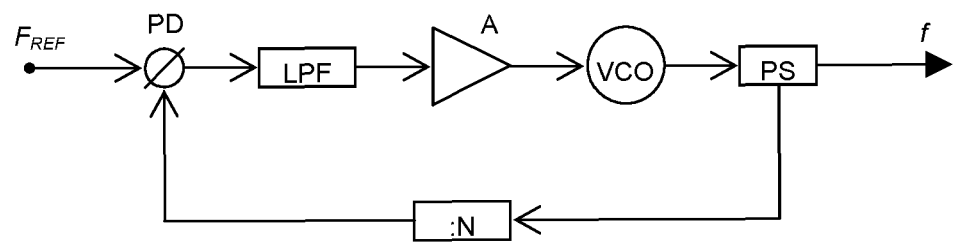
FIG. 1 shows a simplified block diagram of a prior art PLL synthesizer.
Figure 2:
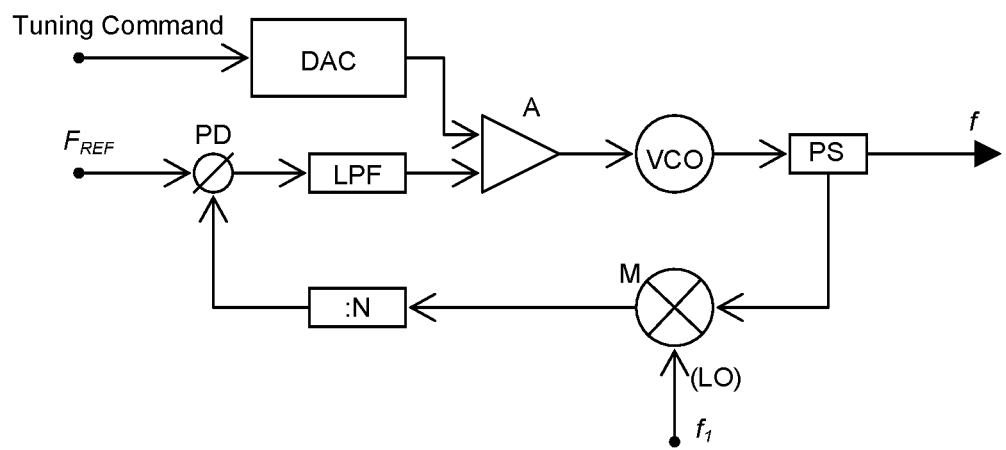
FIG. 2 shows a simplified block diagram of a prior art synthesizer employing a frequency conversion.
Figure 3:
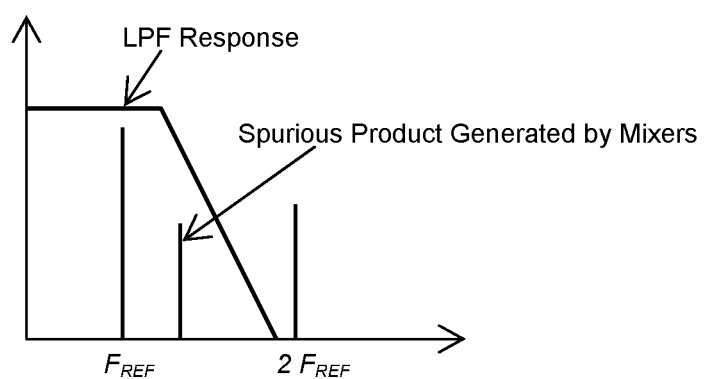
FIG. 3 shows an example of the spurious frequency signals (spurious products generated by mixers) that can occur in some prior art synthesizers.
Figure 4:
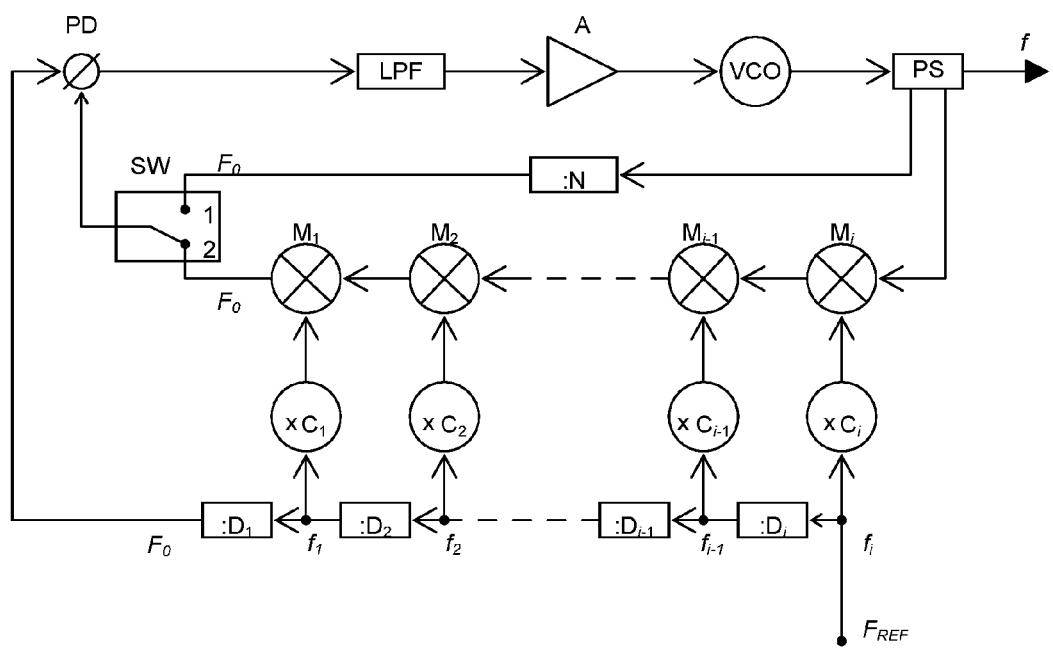
FIG. 4 shows a simplified block diagram for the prior art synthesizer of U.S. Pat. No. 7,701,299, which employed multiple frequency conversions in the synthesizer feedback loop.
Figure 5:
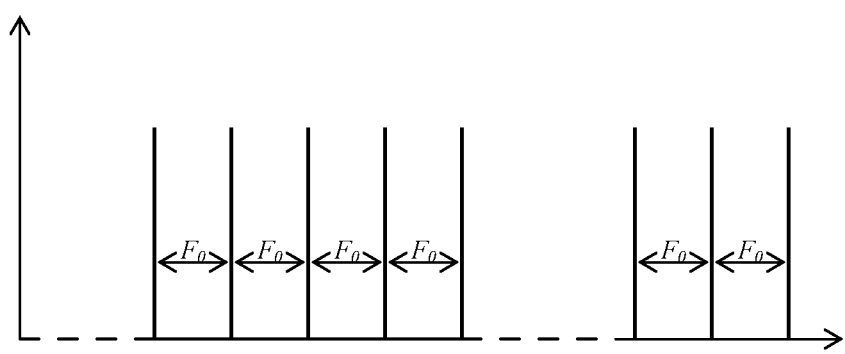
FIG. 5 shows an example of the output frequencies generated by a conventional synthesizer with multiple frequency conversions in the synthesizer feedback loop.
Figure 6:
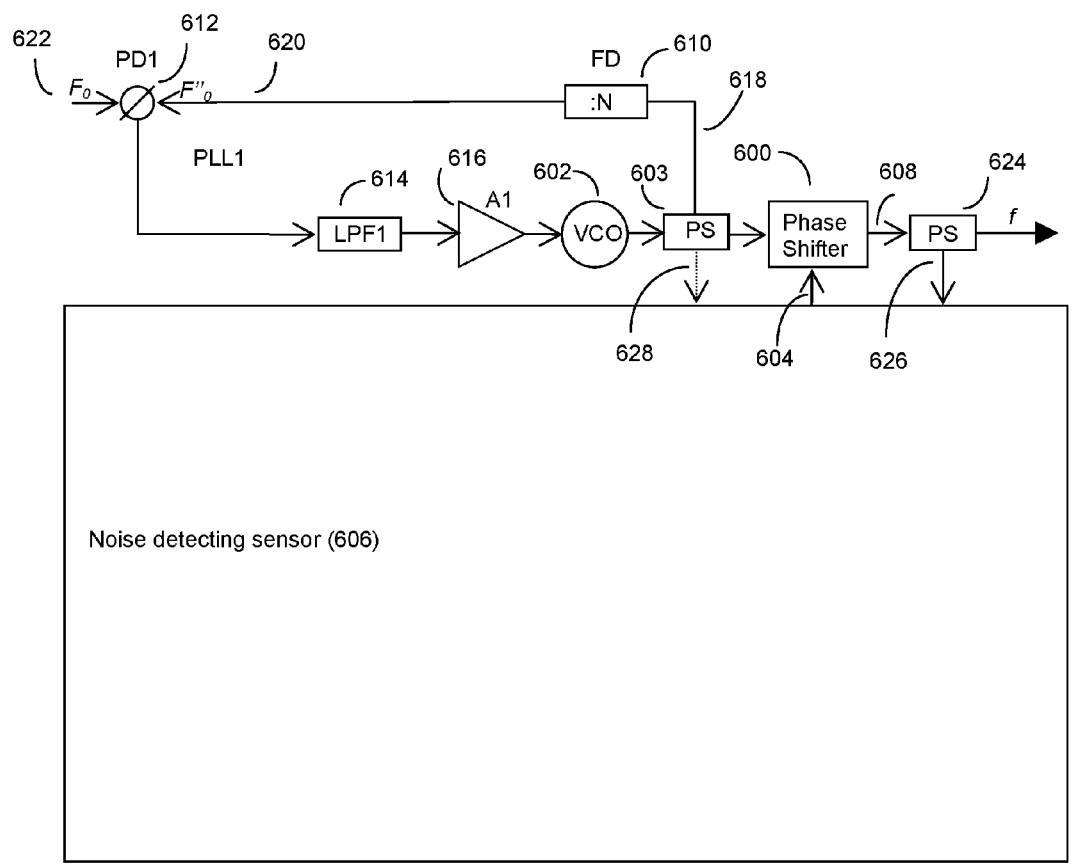
FIG. 6 shows a simplified diagram of the invention's noise correcting frequency synthesizer.

FIG. 6 shows a simplified diagram of the invention's noise correcting phase-locked loop frequency synthesizer. In this embodiment, the invention may comprise a phase shifter (600) configured to simultaneously accept an uncorrected frequency from a VCO (602) (in some embodiments by way of an optional power splitter 603), and noise reducing control signals (604) from a noise detecting sensor (606), and output a noise-corrected VCO frequency signal.

In some embodiments of the present invention, the VCO (602) may be driven by a frequency divider (FD, 610), a first phase detector (PD1, 612), first low pass filter (LPF, 614), and first amplifier (A1, 616). Here this frequency divider (FD, 610) may be configured to frequency divide a first portion (618) of the noise uncorrected VCO frequency signal (618), (in some embodiments by way of an optional power splitter 603) and provide a frequency divided noise uncorrected VCO frequency signal ($F_0''$, 620) as input to the first phase detector (PD1, 612).

This first phase detector (PD1, 612), first low pass filter (LPF1, 614), and the first amplifier (A1, 616) may be configured to use the frequency divided noise uncorrected VCO frequency signal ($F_0''$, 620), and a step-size reference frequency ($F_0$), to drive the VCO (602) to oscillate at a desired frequency that is a multiple of the step-sized reference frequency $F_0$.

This configuration also can be viewed as forming a phase locked loop PLL1, alternatively referred to as an integer-N single-loop PLL synthesizer.

In a preferred embodiment, the frequency divider (FD, 610) can be a programmable frequency divider with a programmable division coefficient N, where N is typically a positive integer, often a high multiple positive integer with values of magnitude 10, 100, 1000, 10,000 or more. Thus frequency divider (FD, 610) can also be viewed as a divider having a high, integer-N division coefficient or ratio, often with a division coefficient greater than 100, 1000, 10,000 or more.

In some embodiments, the noise detecting sensor (606) is configured to compare a difference between at least a portion (this can be a converted portion) of the noise-corrected VCO frequency signal (626), and a lower noise reference at a same VCO frequency (such as $F_0$ or $F_{REF}$), and to use this difference to produce the noise correcting control signals (604) for the phase shifter (600). In other configurations, the noise detecting sensor (606) may be configured to directly sample (such as by way of optional first power splitter 603) the uncorrected VCO frequency signal (628) before the phase shifter (600) either as an alternative to signal (626), or in addition to signal (625).

Here $F_{REF}$ can be a fixed-frequency, high-stability, low phase noise oscillator, such as an ovenized (oven-controlled) crystal oscillator (OCXO).

Figure 7:
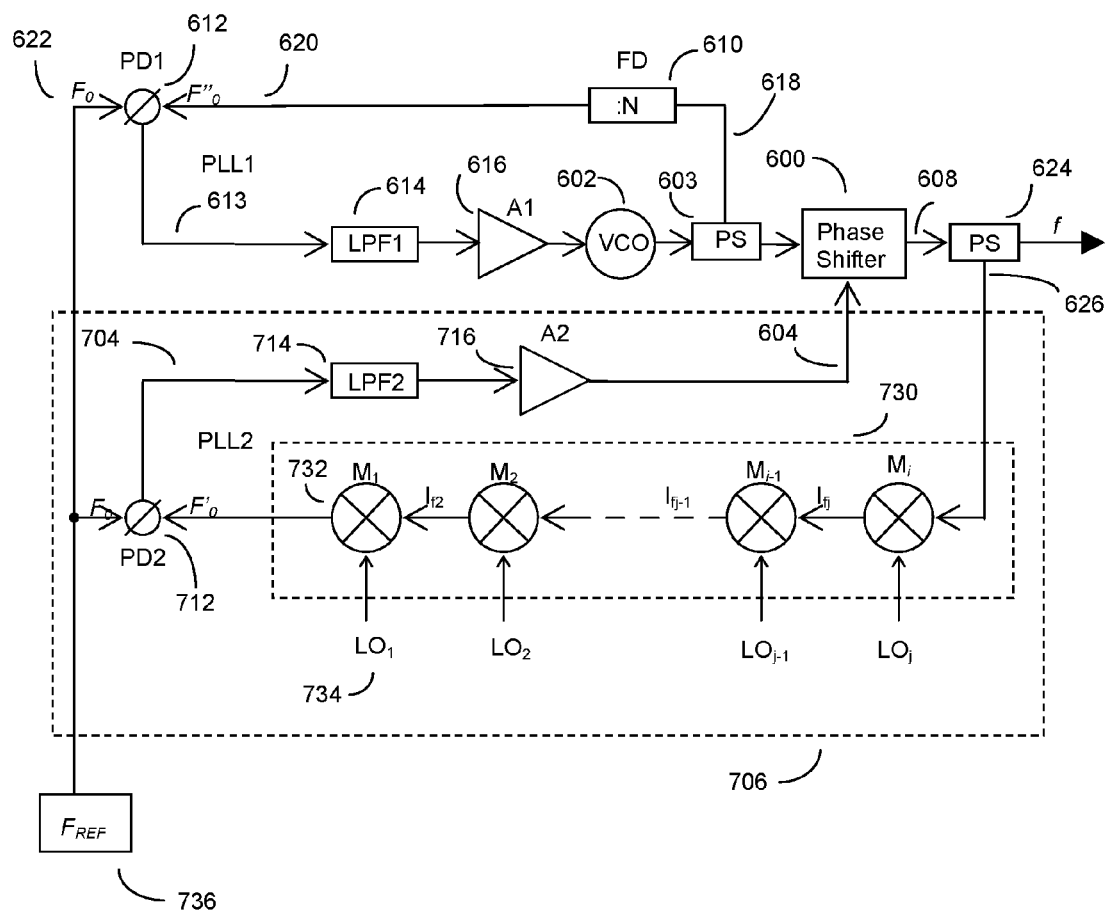
FIG. 7 shows an alternate diagram of the invention's noise correcting frequency synthesizer.

FIG. 7 shows an alternate diagram of the invention's noise correcting frequency synthesizer.

In this embodiment, the noise detecting sensor (706) comprises a second phase detector (PD2, 712), second low pass filter (LPF2, 714), second amplifier (A2, 716), and a plurality of series connected mixer stages (730). Here each mixer stage typically comprises a mixer ($M_x$, 732) and a corresponding local oscillator circuit ($LO_x$, 734) for that particular mixer.

In this embodiment, this plurality of series connected mixer stages (730), and the second phase detector (PD2, 712) are configured to compare the noise-corrected VCO frequency signal (626) with a low-phase-noise reference frequency signal (such as the $LO_x$, 734), producing phase noise difference signals (704). The second low pass filter (LPF2, 714) and second amplifier (A2, 716) are configured to use these phase noise difference (704) signals to provide the noise reducing control signals (604) to the phase shifter (600).

This invention may often also further comprise a low-phase-noise reference frequency generator (736), used to generate $F_{REF}$ (also referred to as $F_0$).

This plurality of series connected mixer stages (730, 732) are, in some embodiments, configured to compare a second portion of the noise-corrected VCO frequency signal (626) with at least one low-phase-noise reference frequency signal (often provided by the local oscillators $LO_1$ ... $LO_j$). This can be done by, for example, converting the second portion (626) of the noise-corrected VCO frequency, through a plurality of intermediate frequencies $I_{fx}$, into a comparison frequency $F_0'$ that is a function of a step-size reference frequency ($F_0$) provided by $F_{REF}$ (736) and a noise component (here this noise component will vary depending on how much noise is detected). This comparison frequency $F_0'$ is then provided as input into the second phase detector (712), essentially as a modified (frequency down-converted) version of the second portion of the noise-corrected VCO frequency signal (626).

More specifically, FIG. 7 shows that the improved frequency synthesizer can include a tunable voltage controlled oscillator VCO (602) (followed in some embodiments by way of optional first power splitter 603), followed by a phase shifter (600) and another (e.g. second) power splitter PS (624). A first portion (618) of the VCO output signal f (in some embodiments provided by way of an optional first power splitter 603) is divided by frequency divider FD (610), (preferably with a programmable division coefficient N) and this signal (620, $F_0''$) goes to the phase detector PD1 (612). The phase detector PD1 compares the signals ($F_0$, and $F_0''$) at both inputs and generates an error voltage (613) which, following filtering in low-pass loop filter LPF1 (614) and amplification by operational amplifier A1 (616) respectively, slews the frequency of the VCO (602) to a lock frequency given by $$f = F_0 \times N$$

Thus, the first phase lock loop (PLL1) with the programmable divider (610) provides a simple and reliable mechanism to pre-tune the VCO (602) to the desired frequency. However the phase noise of the generated signal is degraded by the division coefficient N at 20 log N rate, so this creates some undesired phase noise.

In this embodiment, the noise sensor (606) can comprise a second phase lock loop PLL2 that detects the phase noise produced by the first phase lock loop, and sends correcting signals to the phase shifter (600) to compensate and reduce this noise, while, at the same time, PLL1 continues to operate. Note that in contrast to U.S. Pat. No. 7,701,299, PLL1 has not been switched out of the circuit. This avoids the various switching issues associated with U.S. Pat. No. 7,701,299.

In this embodiment, the VCO output signal f (626) is converted in mixers $M_1$-$M_i$ to a compassion frequency $F_0'$ that is substantially equal to the synthesizer step size (resolution). This is provided as one input to the second phase detector (PD2, 712).

The other phase detector (PD2, 712) comparison frequency input $F_0$, as well as the various mixer $LO_x$ signals, can be produced from a common high-stable, low phase noise reference signal $F_{REF}$, and or a multiple of $F_{REF}$ which may in some embodiments be produced by frequency multiplier (806).

Figure 8:
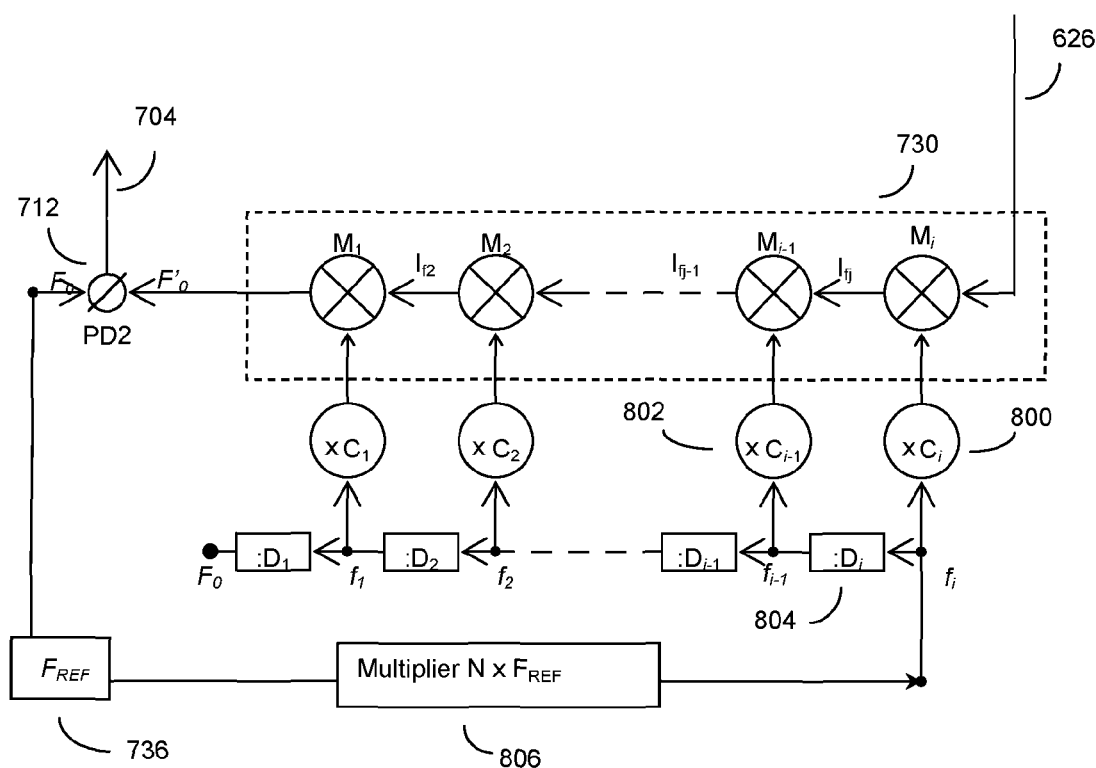
FIG. 8 shows one method of providing local oscillator signals to a plurality of series connected mixers.

Here, an important aspect of this embodiment, as well as the embodiment discussed in FIG. 8, is that this portion of the circuit is designed so that the total amount (e.g. sum) of the noise contributed by each mixer and it's corresponding local oscillator circuit, over the various of series connected mixer stages, is configured or selected to have a combined phase noise that is substantially less than a phase noise produced by first loop PLL1 containing the frequency divider (610). This constraint is needed so that the noise detector circuit, by virtue of being less noisy than the noise produced by the PLL1 circuit employing frequency divider (610), thus can, by use of phase detector 2 (PD2, 712) detect noise and ultimately send noise correction signals to the phase shifter (600).

FIG. 8 shows a diagram of one method of providing local oscillator signals to a plurality of mixer stages.

In some embodiments, the plurality of series connected mixer stages (730) may be configured to produce the various intermediate frequencies $I_f$ by configuring the mixer stages to produce a difference between a mixer input frequency (e.g. an intermediate frequency $I_f$ produced by the previous mixer in the series), and that mixer's particular local oscillator signal ($LO_x$).

These local oscillator signals $LO_x$ can be produced by various schemes. In one scheme, the various local oscillator signals (734) may be produced by a multiplier $xC_x$ (800, 802) acting on a frequency divided (using local oscillator frequency dividers :Dx, 804) input frequency from either a low phase noise reference frequency (which can be provided by $F_{REF}$ or a multiplied $N \times F_{REF}$ source 806) or a previous local oscillator frequency divided (804) version of this low phase noise reference frequency. These local oscillator frequency dividers :Dx (804) are also occasionally designated as local oscillator divider devices, which are a component of the various corresponding local oscillator circuits used to provide the various corresponding local oscillator signals.

Thus in one embodiment, the various local oscillator signals can be produced using a circuit similar to that previously taught in U.S. Pat. No. 7,701,299. As a result, in this particular case, the resulting local oscillator frequency calculations can also be similar.

More specifically, the comparison frequency $F_0'$, as well as the various mixer LO signals (734) may be produced from a common high-stable, low phase noise reference signal $F_{REF}$ (736) using local oscillator frequency dividers (804) with frequency division ratios $D_1$-$D_1$ as well as frequency multipliers (800, 802) with multiplication factors $C_1$-$C_i$ respectively. In some embodiments, these multipliers can be comb generators, with a frequency output signal that contains a large number of harmonics.

The invention claimed is:

1. A noise-corrected phase-locked loop frequency synthesizer device comprising:
   a phase shifter configured to simultaneously accept a noise-uncorrected VCO frequency signal from a VCO, and noise reducing control signals from a noise detecting sensor, and output a noise-corrected VCO frequency signal;
   wherein said noise detecting sensor is configured to compare a difference between said noise-corrected VCO frequency signal, and a lower noise reference at a same VCO frequency, and to use said difference to produce said noise correcting control signals for said phase shifter; and
   wherein said noise detecting sensor comprises a second phase detector, second low pass filter, second amplifier, and a plurality of series connected mixer stages;
   each said mixer stage comprising a mixer and a corresponding local oscillator circuit;
   wherein said plurality of series connected mixer-stages and said second phase detector are configured to compare said noise-corrected VCO frequency signal with a low-phase-noise reference frequency signal, producing phase noise difference signals;
   said second low pass filter and said second amplifier configured to use said phase noise difference signals to provide said noise reducing control signals to said phase shifter.

2. The device of claim 1, wherein said VCO is driven by a frequency divider, first phase detector, first low pass filter, and first amplifier; and
   wherein said frequency divider is configured to frequency divide said noise-uncorrected VCO frequency signal, and provide a frequency divided noise-uncorrected VCO frequency signal as input to said first phase detector;
   said first phase detector, first low pass filter, and said first amplifier configured to use said frequency divided said noise-uncorrected VCO frequency signal, and a step-size reference frequency ($F_0$), to drive said VCO to oscillate at a desired frequency that is a multiple of said step-sized reference frequency $F_0$.

3. The device of claim 2, further comprising a power splitter configured to provide said noise-uncorrected VCO frequency signal to said frequency divider; and wherein said frequency divider is a programmable frequency divider with a programmable division coefficient N.

4. The device of claim 1, further comprising a power splitter configured to provide said noise-corrected VCO frequency signal.

5. The device of claim 1, further comprising a low-phase-noise reference frequency generator.

6. The device of claim 1, wherein said plurality of series connected mixer stages are configured to compare said noise-corrected VCO frequency signal with a low-phase-noise reference frequency signal by converting said noise-corrected VCO frequency signal, through a plurality of intermediate frequencies $I_f$, into a comparison frequency $F_0'$, provided as input into said second phase detector, as said noise-corrected VCO frequency signal, that is a function of a step-size reference frequency ($F_0$) and a noise component.

7. The device of claim 6, wherein said plurality of series connected mixer stages are configured to produce each said plurality of intermediate frequencies $I_f$ by a difference between a mixer input frequency, and a local oscillator signal produced by a corresponding local oscillator circuit comprising a multiplier acting on a local oscillator frequency divided input frequency from either a low phase noise reference frequency or a previous local oscillator frequency divided version of said low phase noise reference frequency.

8. A noise-corrected phase-locked loop frequency synthesizer device comprising:
   a phase shifter configured to simultaneously accept a noise-uncorrected VCO frequency signal from a VCO, and noise reducing control signals from a noise detecting sensor, and output a noise-corrected VCO frequency signal;
   wherein said VCO is driven by a frequency divider, power splitter, first phase detector, first low pass filter, and first amplifier; and
   wherein said frequency divider is a programmable frequency divider with a programmable division coefficient N, said frequency divider configured to frequency divide said noise-uncorrected VCO frequency signal provided by said power splitter, and provide a frequency divided noise-uncorrected VCO frequency signal as input to said first phase detector;
   said first phase detector, first low pass filter, and said first amplifier configured to use said frequency divided noise-uncorrected VCO frequency signal, and a step-size reference frequency ($F_0$), to drive said VCO to oscillate at a desired frequency that is a multiple of said step-sized reference frequency $F_0$;
   wherein said noise detecting sensor is configured to compare a difference between at least a portion of said noise-corrected VCO frequency signal, and a lower noise reference at a same VCO frequency, and to use said difference to produce said noise correcting control signals for said phase shifter.

9. The device of claim 8, wherein said noise detecting sensor comprises a second phase detector, second low pass filter, second amplifier, and a plurality of series connected mixer stages;
   each said mixer stage comprising a mixer and a corresponding local oscillator circuit;
   wherein said plurality of series connected mixer stages and said second phase detector are configured to compare said noise-corrected VCO frequency signal provided by said power splitter, with a low-phase-noise reference frequency signal, producing phase noise difference signals;

said second low pass filter and said second amplifier configured to use said phase noise difference signals to provide said noise reducing control signals to said phase shifter.

10. The device of claim 9, wherein said plurality of series connected mixer stages are configured to compare said noise-corrected VCO frequency signal with a low-phase-noise reference frequency by converting said noise-corrected VCO frequency signal, through a plurality of intermediate frequencies $I_f$, into a comparison frequency $F_0'$ provided as input into said second phase detector, as said noise-corrected VCO frequency signal, that is a function of a step-size reference frequency ($F_0$) and a noise component.

11. The device of claim 10, wherein said plurality of series connected mixer stages are configured to produce each said plurality of intermediate frequencies $I_f$ by a difference between a mixer input frequency, and a local oscillator signal produced by a corresponding local oscillator circuit comprising a multiplier acting on a local oscillator frequency divided input frequency from either a low phase noise reference frequency or a previous local oscillator frequency divided version of said low phase noise reference frequency.

12. The device of claim 9, wherein a sum of each said mixer and said corresponding local oscillator circuit over said plurality of series connected mixer stages is selected to have a combined phase noise that is substantially less than a phase noise produced by a frequency divider-driven phase lock loop driven by said frequency divider.

13. The device of claim 9, wherein at least some of said corresponding local oscillator circuits further comprises a local oscillator divider device.

14. A method of noise-correcting a phase-locked loop frequency synthesizer, said method comprising:

obtaining a phase locked loop frequency synthesizer comprising a VCO, a noise detecting sensor, and a phase shifter;

using said phase shifter to simultaneously accept a noise-uncorrected VCO frequency signal from said VCO, and noise reducing control signals from said noise detecting sensor, and output a noise-corrected VCO frequency signal;

further using said noise detecting sensor to compare a difference between at least a portion of said noise-corrected VCO frequency signal, and a lower noise reference signal at a same VCO frequency, and to use said difference to produce said noise correcting control signals for said phase shifter; and wherein said noise detecting sensor comprises a second phase detector, second low pass filter, second amplifier, and a plurality of series connected mixer stages;

each said mixer stage comprising a mixer and a corresponding local oscillator circuit;

using said plurality of series connected mixer stages and said second phase detector to compare said noise-corrected VCO frequency signal with a low-phase-noise reference frequency signal, and to produce phase noise difference signals; and using second low pass filter, said second amplifier and said phase noise difference signals to provide said noise reducing control signals to said phase shifter.

15. The method of claim 14, further using a frequency divider, first phase detector, first low pass filter, and first amplifier to drive said VCO by:

using said frequency divider to frequency divide said noise-uncorrected VCO frequency signal, and to provide a frequency divided noise uncorrected VCO frequency signal as input to said first phase detector;

using said first phase detector, first low pass filter, said first amplifier, said frequency divided noise uncorrected VCO frequency signal, and a step-size reference frequency ($F_0$), to drive said VCO at a desired frequency that is a multiple of said step-sized reference frequency $F_0$.

* * * * *